(12) United States Patent
Gianoulakis et al.

(10) Patent No.: US 6,441,885 B2
(45) Date of Patent: Aug. 27, 2002

(54) LOW THERMAL DISTORTION EXTREME-UV LITHOGRAPHY RETICLE

(75) Inventors: Steven E. Gianoulakis, Albuquerque, NM (US); Avijit K. Ray-Chaudhuri, Livermore, CA (US)

(73) Assignee: EUV LLC, Santa Clara, CA (US)

(*) Notice: Subject to any disclaimer, the term of this patent is extended or adjusted under 35 U.S.C. 154(b) by 0 days.

(21) Appl. No.: 09/903,196

(22) Filed: Jul. 10, 2001

Related U.S. Application Data

(62) Division of application No. 09/139,149, filed on Aug. 24, 1998.

(51) Int. Cl.[7] .............................. G03B 27/42; G03F 9/00; G21K 5/00
(52) U.S. Cl. .................. 355/53; 430/5; 378/35
(58) Field of Search .............................. 355/53, 51, 57, 355/60, 66, 75; 430/5, 322, 323, 324; 378/35

*Primary Examiner*—Russell Adams
*Assistant Examiner*—Peter B. Kim
(74) *Attorney, Agent, or Firm*—Burns Doane Swecker & Mathis LLP

(57) ABSTRACT

Thermal distortion of reticles or masks can be significantly reduced by emissivity engineering, i.e., the selective placement or omission of coatings on the reticle. Reflective reticles so fabricated exhibit enhanced heat transfer thereby reducing the level of thermal distortion and ultimately improving the quality of the transcription of the reticle pattern onto the wafer. Reflective reticles include a substrate having an active region that defines the mask pattern and non-active region(s) that are characterized by a surface that has a higher emissivity than that of the active region. The non-active regions are not coated with the radiation reflective material.

25 Claims, 2 Drawing Sheets

LOW THERMAL DISTORTION EXTREME-UV LITHOGRAPHY RETICLE

This application is a divisional of application Ser. No. 09/139,149, filed on Aug. 24, 1998.

This invention was made with government support under contract No. DE-AC04-94-AL85000 awarded by the U.S. Department of Energy to Sandia Corporation. The government has certain rights to the invention.

FIELD OF THE INVENTION

The invention relates to projection lithography employing soft x-rays and in particularly to reticles that exhibit minimum thermal distortion during scanning. The invention is particularly suited for systems that use a camera that images with acuity along a narrow arc or ringfield. The camera employs the ringfield to scan the reflective reticle and translate a pattern onto the surface of a wafer.

BACKGROUND OF THE INVENTION

In general, lithography refers to processes for pattern transfer between various media. A lithographic coating is generally a radiation-sensitized coating suitable for receiving a projected image of the subject pattern. Once the image is projected, it is indelibly formed in the coating. The projected image may be either a negative or a positive of the subject pattern. Typically, a "transparency" of the subject pattern is made having areas which are selectively transparent, opaque, reflective, or non-reflective to the "projecting" radiation. Exposure of the coating through the transparency causes the image area to become selectively crosslinked and consequently either more or less soluble (depending on the coating) in a particular solvent developer. The more soluble (i.e., uncrosslinked) areas are removed in the developing process to leave the pattern image in the coating as less soluble crosslinked polymer.

Projection lithography is a powerful and essential tool for microelectronics processing. As feature sizes are driven smaller and smaller, optical systems are approaching their limits caused by the wavelengths of the optical radiation. "Long" or "soft" x-rays (a.k.a. Extreme UV) (wavelength range of $\lambda=100$ to 200 Å ("Angstrom") are now at the forefront of research in efforts to achieve the smaller desired feature sizes. Soft x-ray radiation, however, has its own problems. The complicated and precise optical lens systems used in conventional projection lithography do not work well for a variety of reasons. Chief among them is the fact that there are no transparent, non-absorbing lens materials for soft x-rays and most x-ray reflectors have efficiencies of only about 70%, which in itself dictates very simple beam guiding optics with very few surfaces.

One approach has been to develop cameras that use only a few surfaces and can image with acuity (i.e., sharpness of sense perception) only along a narrow arc or ringfield. Such cameras then scan a reflective mask across the ringfield and translate the image onto a scanned wafer for processing. Although cameras have been designed for ringfield scanning (e.g., Jewell et al., U.S. Pat. No. 5,315,629 and Offner, U.S. Pat. No. 3,748,015), available condensers that can efficiently couple the light from a synchrotron source to the ringfield required by this type of camera have not been fully explored. Furthermore, full field imaging, as opposed to ringfield imaging, requires severely aspheric mirrors in the camera. Such mirrors cannot be manufactured to the necessary tolerances with present technology for use at the required wavelengths.

The present state-of-the-art for Very Large Scale Integration ("VLSI") involves chips with circuitry built to design rules of 0.25 μm. Effort directed to further miniaturization takes the initial form of more fully utilizing the resolution capability of presently-used ultraviolet ("UV") delineating radiation. "Deep UV" (wavelength range of $\lambda=0.3$ μm to 0.1 μm), with techniques such as phase masking, off-axis illumination, and step-and-repeat may permit design rules (minimum feature or space dimension) of 0.18 μm or slightly smaller.

To achieve still smaller design rules, a different form of delineating radiation is required to avoid wavelength-related resolution limits. One research path is to utilize electron or other charged-particle radiation. Use of electromagnetic radiation for this purpose will require x-ray wavelengths.

A variety of x-ray patterning approaches are under study. Probably the most developed form of x-ray lithography is proximity printing. In proximity printing, object:image size ratio is necessarily limited to a 1:1 ratio and is produced much in the manner of photographic contact printing. A fine-membrane mask is maintained at one or a few microns spacing from the wafer (i.e., out of contact with the wafer, thus, the term "proximity"), which lessens the likelihood of mask damage but does not eliminate it. Making perfect masks on a fragile membrane continues to be a major problem. Necessary absence of optics in-between the mask and the wafer necessitates a high level of parallelism (or collimation) in the incident radiation. X-ray radiation of wavelength $\lambda \leq 16$ Å is required for 0.25 μm or smaller patterning to limit diffraction at feature edges on the mask.

Use has been made of the synchrotron source in proximity printing. Consistent with traditional, highly demanding, scientific usage, proximity printing has been based on the usual small collection arc. Relatively small power resulting from the 10 mrad to 20 mrad arc of collection, together with the high-aspect ratio of the synchrotron emission light, has led to use of a scanning high-aspect ratio illumination field (rather than the use of a full-field imaging field).

Projection lithography has natural advantages over proximity printing. One advantage is that the likelihood of mask damage is reduced, which reduces the cost of the now larger-feature mask. Imaging or camera optics in-between the mask and the wafer compensate for edge scattering and, so, permit use of longer wavelength radiation. Use of extreme ultra-violet radiation (a.k.a., soft x-rays) increases the permitted angle of incidence for glancing-angle optics. The resulting system is known as extreme UV ("EUVL") lithography (a.k.a., soft x-ray projection lithography ("SXPL")).

A favored form of EUVL is ringfield scanning. All ringfield optical forms are based on radial dependence of aberration and use the technique of balancing low order aberrations, i.e., third order aberrations, with higher order aberrations to create long, narrow illumination fields or annular regions of correction away from the optical axis of the system (regions of constant radius, rotationally symmetric with respect to the axis). Consequently, the shape of the corrected region is an arcuate or curved strip rather than a straight strip. The arcuate strip is a segment of the circular ring with its center of revolution at the optic axis of the camera. See FIG. 4 of U.S. Pat. No. 5,315,629 for an exemplary schematic representation of an arcuate slit defined by width, W, and length, L, and depicted as a portion of a ringfield defined by radial dimension, R, spanning the distance from an optic axis and the center of the arcuate slit. The strip width is a function of the smallest feature to be printed with increasing residual astigmatism, distortion, and Petzval curvature at distances greater or smaller than the design radius being of greater consequence for greater resolution. Use of such an arcuate field allows minimization of radially-dependent image aberrations in the image. Use of object:image size reduction of, for example, 5:1 reduction, results in significant cost reduction of the, now, enlarged-feature mask.

Masks or reticles for EUV projection lithography typically comprise a silicon substrate coated with an x-ray reflective material and an optical pattern fabricated from an x-ray absorbing material that is formed on the reflective material. In operation, EUV radiation from the condenser is projected toward the surface of the reticle and radiation is reflected from those areas of the reticle reflective surface which are exposed, i.e., not covered by the x-ray absorbing material. The reflected radiation effectively transcribes the pattern from the reticle to the wafer positioned downstream from the reticle. Among the problems encountered in EUV projection lithography are point-to-point reflectivity variations. The art is in search of techniques to reduce reticle distortions.

SUMMARY OF THE INVENTION

The present invention is based in part on the recognition that thermal distortion in reticles can be significantly reduced by fabricating reticles exhibiting improved radiative cooling in vacuum systems. For example, this can be achieved by designing the nonactive regions of reflective reticles not to be coated with the high reflective material that is found on the surface of the active region where the pattern is formed. Alternatively, the nonactive regions can be coated with a high emissivity material. By employing emissivity engineering which involves the selective placement or omission of coatings on the reticle, the inventive reflective reticle fabricated will exhibit enhanced heat transfer thereby reducing the level of thermal distortion. Ultimately, the quality of the transcription of the reticle pattern onto the wafer is improved.

Accordingly, in one aspect, the invention is directed to a reflective reticle that includes:

substrate having an active region on a first surface of the substrate; and at least one non-active region on a second surface of the substrate wherein each non-active region is characterized by having a surface that is formed of material that has an emissivity that is higher than that of the materials forming the active region surface.

In another aspect, the invention is directed to photolithography system that includes:

a source of extreme ultraviolet radiation;

means for collecting the radiation emitted from the source of extreme ultraviolet radiation and forming a light beam therefrom that is directed to an active region of a reflective reticle, wherein the reflective reticle includes:

(i) a substrate having an active region on a first surface of the substrate; and (ii) at least one non-active region on a second surface of the substrate wherein each non-active region is characterized by having a surface that is formed of material that has an emissivity that is higher than that of the materials forming the active region surface; and a wafer disposed downstream from the reflective reticle.

In a further embodiment, the invention is directed to a process for fabrication of a device comprising at least one element having a dimension $\leq 0.25$ $\mu$m, such process comprising construction of a plurality of successive levels, construction of each level comprising lithographic delineation, in accordance with which a subject active region of a reflective reticle is illuminated to produce a corresponding pattern image on the device being fabricated, ultimately to result in removal of or addition of material in the pattern image regions, in which illumination used in fabrication of at least one level is extreme ultra-violet radiation, characterized in that the process employs the inventive reflective reticle.

Modeling studies suggest that emissivity engineering can effectively reduce the distortions especially for reflective silicon reticles. For silicon reticles, simulations have shown an 82% reduction in total placement errors and a 25% reduction in residual placement errors.

DETAILED DESCRIPTION OF THE INVENTION

Figure 1:
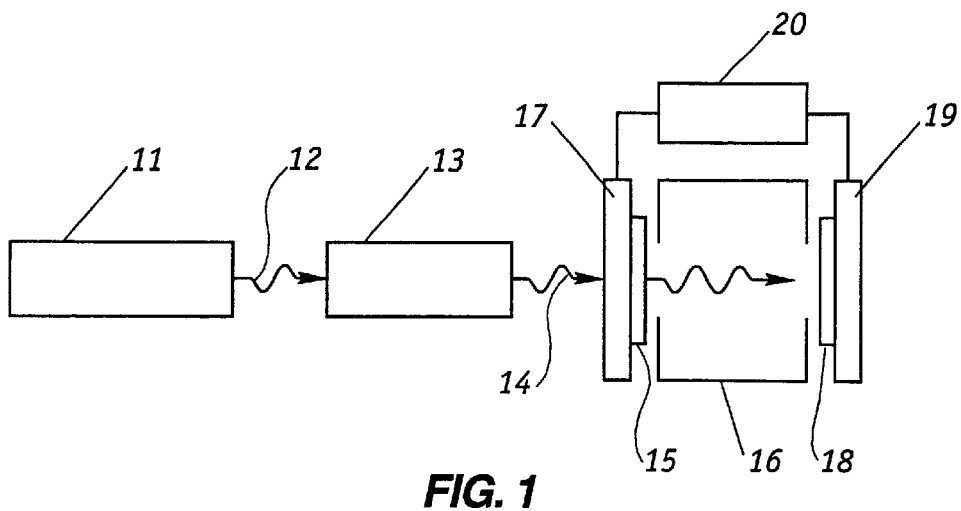
FIG. 1 is a schematic of an EUV lithography device.

FIG. 1 schematically depicts an apparatus for EUV lithography that comprises a radiation source 11, such as a synchrontron or a laser plasma source, that emits x-rays 12 into condenser 13 which in turn emits beam 14 that illuminates a portion of reticle or mask 15. The emerging patterned beam is introduced into the imaging optics 16 which projects an image of reticle or mask 15, shown mounted on mask stage 17, onto wafer 18 which is mounted on stage 19. Element 20, an x-y scanner, scans reticle 15 and wafer 18 in such direction and at such relative speed as to accommodate the desired mask-to-image reduction.

The wafer is preferably housed in a wafer chamber that is separated from the other elements of the photolithography system located upstream as illustrated in FIG. 1. These other elements can be housed in one or more chambers which are preferably maintained in vacuum to minimize attenuation of the x-rays. EUV radiation projected from the reticle and translated by the camera travels through an aperture in the wafer chamber.

The EUV lithography device of the present invention is particularly suited for fabricating integrated devices that comprise at least one element having a dimension of $\leq 0.25$ $\mu$m. The process comprises construction of a plurality of successive levels by lithographic delineation using a mask pattern that is illuminated to produce a corresponding pattern image on the device being fabricated, ultimately to result in removal of or addition of material in the pattern image regions. Typically, where lithographic delineation is by projection, the collected radiation is processed to accommodate imaging optics of a projection camera and image quality that is substantially equal in the scan and cross-scan directions, and smoothly varying as the space between adjacent lines varies. In a preferred embodiment, projection comprises ringfield scanning comprising illumination of a straight or arcuate region of a projection reticle. In another preferred embodiment, projection comprises reduction ring-field scanning in which an imaged arcuate region on the image plane is of reduced size relative to that of the subject arcuate region so that the imaged pattern is reduced in size relative to the reticle region.

The individual elements that form the EUV lithography device as shown in FIG. 1 can comprise conventional optical devices, e.g., condensers, cameras, and lens, for projection EUV lithography. Preferably the EUVL device employs a condenser that collects soft x-rays for illuminating a ring-field camera. A particularly preferred EUVL device that employs a condenser having a diffraction grating on the surface of a mirror upstream from the reflective mask that enhances critical dimension control is described in Sweatt et al., U.S. patent application Ser. No. 09/130,224, entitled "Diffractive Element in Extreme-UV Lithography Condenser" filed on Aug. 6, 1998 (Docket No. 023890-003) which is incorporated by reference. The condenser illustrated therein has the ability to separate the light from a line or quasi point source at the entrance pupil into several separated lines or transform point foci that are still superimposed on each other at the ringfield radius, thus maximizing the collection efficiency of the condenser and smoothing out any inhomogeneties in the source optics.

Figure 2A:
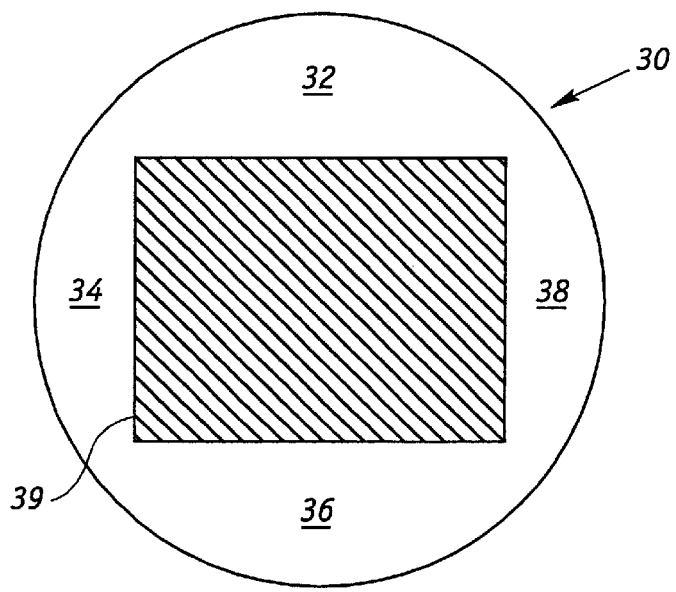
FIGS. 2A and 2B are plan and cross-sectional views, respectively, of a reflective reticle.

FIG. 2A shows a reflective reticle 30 having a generally circular perimeter; it is understood that the perimeter of reflective reticle for the present invention can have any figure including, for example, polygons. The surface of the reflective reticle includes an active region 39 where the mask pattern is formed. During projection printing, EUV radiation is reflected from the active region and onto the wafer. The surface of the reflective reticle also includes non-active regions 32, 34, 36, and 38. EUVL preferably employs an x-ray radiation source at about 13 nm, but the absorption at this wavelength is very strong in essentially all materials; therefore, EUVL employs reflective optics such as Mo/Si multilayer mirrors. The multilayer mirror, which typically ranges from about 280 nm to 320 nm in thickness, can also be made from, for example, Mo/Be. The strong x-ray absorption also necessitates the use of reflective mask or reticle patterns which are typically made by depositing absorber patterns on top of the Mo/Si multilayer mirror as described, for instance, in U.S. Pat. No. 5,052,033, and D. M. Tennant et. al., Appl. Opt. 32, 7007 (1993), which are incorporated herein by reference.

Figure 2B:
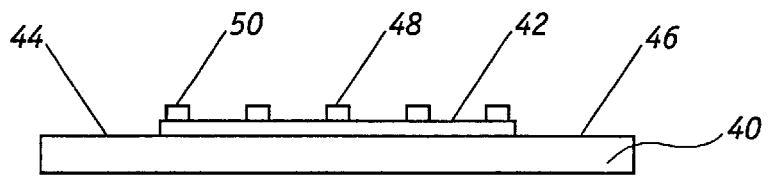

FIG. 2B shows the cross-section of inventive reflective reticle that comprises a silicon substrate 40 having a mask pattern that comprises a multilayer mirror structure 42 onto which absorber patterns 48 and 50 are deposited. Silicon substrates that are doped, e.g., by arsenic, boron, or phosphorus, are preferred since they have higher emissivity levels than pure silicon. Absorber materials typically comprises tungsten, titanium, titanium nitride, or aluminum. As illustrated in FIG. 2B, non-active regions 44 and 46 do not include the multilayer reflective structure, rather, in this embodiment, the surface of the non-active regions is bare or exposed silicon. As described herein, it has been demonstrated that not covering the non-active regions with the multilayer reflective structure or any low emissivity material reduces thermal distortion. The reflective reticle as illustrated in FIG. 2B can be made by conventional methods. During the fabrication process, the surface of the silicon substrate corresponding to non-active regions 44 and 46 is covered with photoresist so that subsequent sputtering of the Mo/Si multilayer coating will not deposit any of the reflective substances onto these regions.

In addition to constructing the nonactive regions with high emissivity surface materials, further reduction of reticle thermal distortion can be achieved by choosing materials with higher emissivity in fabricating the active regions. For example, in selecting the absorber material, TiN is preferred because of its high emissivity relative to most other absorber materials. Analogous selection of high emissivity materials from among suitable candidates, with respect to other parts of the active regions, can be employed.

Instead of forming non-active regions having bare silicon surfaces, the non-active regions can comprise regions of the substrate that are covered with a suitable high emissivity material. As is apparent, the use of any substrate compatible material which has an emissitivity that is higher than that of the materials forming the active region should enhance heat dissipation. When the multilayer structure of the active region is made Mo/Si, which as an emissivity of about 0.12, then the substrate covering material must have an emissivity of greater than 0.12. However, preferably this substrate covering material has an emissivity of greater than 0.25, and more preferably greater than 0.40. Suitable high emissivity materials include, for example, metal oxides, e.g., aluminum oxide, copper oxide and molybdenum oxide. From a practical standpoint, given that silicon has an emissivity of 0.72, thermal dissipation will not be significantly enhanced unless the substrate covering material has a very high emissivity value.

As is apparent, for any reflective reticle, the higher the ratio of the non-active region surface area to the active region surface area, the greater the reduction in thermal distortion will be when the non-active region is fabricated without the multilayer reflective structure or is covered with a high emissivity substrate covering material. While the present invention is applicable even if this ratio is small, typically the combined surface area of the non-active regions will range from about 50% to about 60% and preferably at least about 25% and more preferably at least about 40% of the total surface area of the reflective reticle.

A series of simulations were performed to examine the effect of emissivity engineering to reduce the thermal distortions of reflective silicon reticles during scanning. Specifically, the simulation measured the placement errors and blurs associated with conventional and inventive reflective reticles. Placement error is defined as the error in position of a point on the reticle just prior to the arrival of the illumination. Blur is defined as the motion of a point during the time that it is illuminated.

Figure 3:
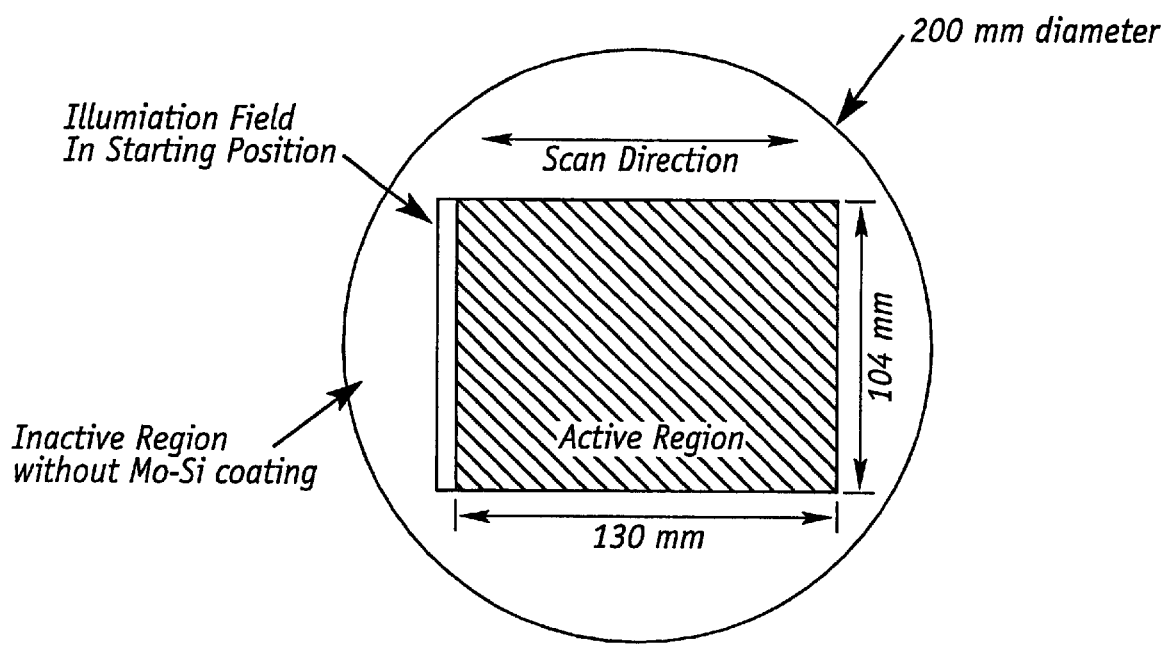
FIG. 3 is a schematic of a dark field reticle.
Figure 4:
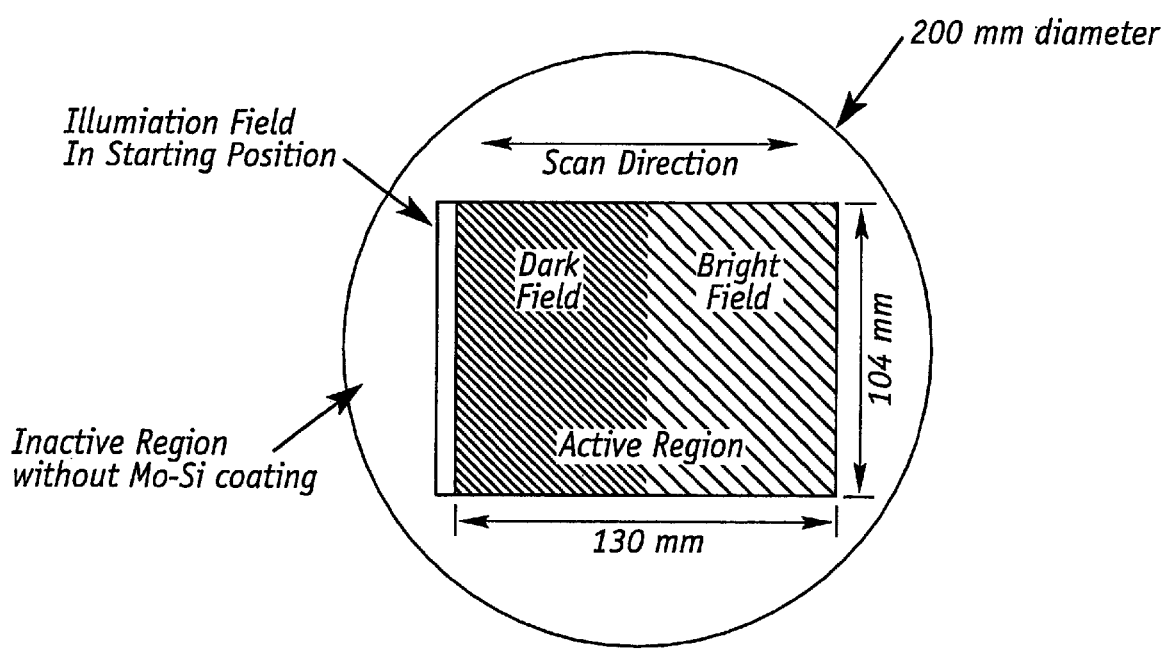
FIG. 4 is a schematic of a half dark/half bright field reticle.

FIGS. 3 and 4 show schematics of a 200 mm diameter by 0.75 mm thick silicon wafer and the active reticle region used for the simulation. The dimensions of the reticle were 130 mm in the direction of the scan and 104 mm normal to the scan. The width of the illumination field was 6 mm and the height was 104 mm. The scan velocity was 38.7 mm/sec. The heat flux in the illumination field was 0.76 mW/mm$^2$. This flux corresponds to the power required to expose 10 wafers/hour with a resist sensitivity of 10 mJ/cm$^2$. The simulation was started with the leading edge of the illumination field aligned with the edge of the reticle. The effect of framing blades was taken into account in this analysis so that the simulated illumination exposed only the active reticle region of the wafer and not the surrounding areas. Dark field and half dark/half bright field reticles were simulated. A schematic of the half dark/half bright reticle configuration is shown in FIG. 4. The dark field reticle conservatively assumes that all incident energy was absorbed. The half dark/half bright field mask assumes all incident energy is absorbed on the dark region and approximately 42 percent is absorbed in the bright region. At the reticle, the integrated average reflectivity for Mo/Si is approximately 58%. The emissivities of the bright and dark fields were based on actual measurements. The emissivity of the Mo/Si coating was 0.122, and that of a tungsten absorber material was 0.037. Outside the active region of the reticle, the Mo/Si coating was not deposited. This region was assumed to be bare silicon with an emissivity of 0.72. The reticle was also allowed to expand freely. This assumption in effect neglected the frictional and electro-static forces on the reticle from the chuck.

The technique used in the finite element analysis to simulate the moving illumination source included the step of tagging all element faces in the active reticle region, and at each time step determining which of the faces were within the bounding area of the moving source. Simple linear equations of motion with constant velocity were used to describe the location of the leading and trailing edges of the source. Finite element faces which lied fully or partially within the boundary of the moving source had an appropriate heat flux boundary condition applied corresponding to the flux within the source and the fraction of the face that lied within the location the source. The silicon material properties used for the simulations are given as follows:

| | |
|---|---|
| Density (Kg/m$^3$) | 2330.0 |
| Thermal Conductivity (W/m K) | 148.0 |
| Specific Heat (J/kg K) | 712.0 |
| Young's Modulus (GPa) | 107.0 |
| Poissons Ratio | 0.25 |
| Coefficient of Thermal Expansion | 2.5E-06 |

The following table provides distortion comparisons for silicon reflective reticles with full Mo/Si coating and bare silicon outside the active region.

| Condition/ Distortion | Dark Field Full Mo/Si Coating | Dark Field Bare Si Outside Active | Half Bright Half Dark Full Mo/Si Coating | Half Bright Half Dark Bare Si Outside Active |
|---|---|---|---|---|
| Total Placement (nm) | 1457.8 | 259.87 | 879.3 | 184.6 |
| Residual Placement (nm) | 6.64 | 4.97 | 7.65 | 7.65 |
| Blur (nm) | 0.67 | 0.69 | 0.72 | 0.70 |

These simulation results strongly suggest that for both dark and half dark/half bright pattern densities, low distortion reticles can be designed using emissivity engineering approaches. In particular, it is demonstrated that by coating only the active region of the reticle with Mo/Si and absorber, and leaving the non-active region uncoated, a significant reduction in total distortion can be achieved.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A photolithography system comprising:
    a source of extreme ultraviolet radiation;
    means for collecting the radiation emmitted from the source of extreme ultraviolet radiation and forming a light beam therefrom that is directed to an active region of a reflective reticle, wherein the reflective reticle comprises:
    (i) a substrate having an active region on a first surface of the substrate wherein the active region comprises (1) a radiation reflective material that is coated on the first surface of the substrate and (2) a pattern comprising a radiation absorbing material formed on the radiation reflective material wherein the pattern of radiation absorbing material partially covers the radiation reflective material wherein the active region defines an outer perimeter situated within the substrate perimeter; and
    (ii) at least one non-active region on a second surface of the substrate wherein the at least one non-active region is characterized by having a surface that is formed of material that has an emissivity that is higher than that of the radiation reflective material of the active region surface wherein the at least one non-active region is positioned along the outer perimeter of the active region and wherein the at least one non-active region has a collective surface area that is at least 25% of the collective surface area of the first and second surfaces of the substrate; and
    a wafer disposed downstream from the reflective reticle.

2. The system of claim 1 wherein the at least one non-active region does not comprise a layer of radiation reflective material.

3. The system of claim 1 wherein the radiation reflective material has a multilayer structure formed of material that is selected from the group consisting of (a) molybdenum and silicon, and (b) molybdenum and beryllium.

4. The system of claim 3 wherein the radiation reflective material has a thickness of between 280 nm to 320 nm.

5. The system of claim 3 wherein radiation absorbing material is selected from the group consisting of tungsten, titanium, titanium nitride, aluminum and mixtures thereof.

6. The system of claim 1 wherein the at least one non-active region is characterized by having a surface that is formed of material that has an emissivity of at least 0.25.

7. The system of claim 1 wherein the at least one non-active region is characterized by having a surface that is formed of material that has an emissivity of at least 0.40.

8. The system of claim 1 wherein the at least one non-active region has a collective surface area that is at least 40% of the collective surface area of the first and second surfaces of the substrate.

9. The system of claim 1 wherein the first surface of the substrate defines a rectangularly-shaped having four sides and the at least one non-active region comprises four non-active regions each of which borders a side of the rectangularly-shaped surface.

10. The reflective reticle of claim 1 wherein the substrate is made of silicon.

11. A photolithography system comprising:
    a source of extreme ultraviolet radiation;
    means for collecting the radiation emitted from the source of extreme ultraviolet radiation and forming a light beam therefrom that is directed to an active region of a reflective reticle, wherein the reflective reticle comprises:
    (i) a substrate made of silicon having an active region on a first surface of the substrate wherein the active region comprises (1) a radiation reflective material that is coated on the first surface of the substrate and (2) a pattern comprising a radiation absorbing material formed on the radiation reflective material wherein the pattern of radiation absorbing material partially covers the radiation reflective material wherein the active region defines an outer perimeter situated within the substrate perimeter; and (ii) at least one non-active region on a second surface of the substrate wherein the at least one non-active region comprises an exposed surface of the silicon substrate wherein the at least one non-active region is positioned along the outer perimeter of the active region and wherein the at least one non-active region has a collective surface area that is at least 25% of the collective surface area of the first and second surfaces of the substrate; and a wafer disposed downstream from the reflective reticle.

12. The system of claim 11 wherein the radiation reflective material has a multilayer structure formed of material that is selected from the group consisting of (a) molybdenum and silicon, and (b) molybdenum and beryllium.

13. The system of claim 12 wherein the radiation reflective material has a thickness of between 280 nm to 320 nm.

14. The system of claim 12 wherein radiation absorbing material is selected from the group consisting of tungsten, titanium, titanium nitride, aluminum and mixtures thereof.

15. The system of claim 11 wherein the at least one non-active region has a collective surface area that is at least 40% of the collective surface area of the first and second surfaces of the substrate.

16. The system of claim 11 wherein the first surface of the substrate defines a rectangularly-shaped surface having four sides and the at least one non-active region comprises four non-active regions each of which borders a side of the rectangularly-shaped surface.

17. A photolithography system comprising:

a source of extreme ultraviolet radiation;

means for collecting the radiation emitted from the source of extreme ultraviolet radiation and forming a light beam therefrom that is directed to an active region of a reflective region reticle, wherein the reflective reticle comprises:

(i) a substrate having an active region on a first surface of the substrate wherein the active region comprises (1) a radiation reflective material that is coated on the first surface of the substrate and (2) a pattern comprising a radiation absorbing material formed on the radiation reflective material wherein the pattern of radiation absorbing material partially covers the radiation reflective material wherein the active region defines an outer perimeter situated within the substrate perimeter; and (ii) at least one non-active region on a second surface of the substrate wherein the at least one non-active region is characterized by having a surface that comprises a metal oxide that has a higher emissivity than that of the radiation reflective material of the active region surface wherein the at least one non-active region is positioned along the outer perimeter of the active region and wherein the at least one non-active region has a collective surface area that is at least 25% of the collective surface area of the first and second surfaces of the substrate; and a wafer disposed downstream from the reflective reticle.

18. The system of claim 17 wherein the at least one non-active region does not comprise a layer of radiation reflective material.

19. The system of claim 17 wherein the radiation reflective material has a multilayer structure formed of material that is selected from the group consisting of (a) molybdenum and silicon, and (b) molybdenum and beryllium.

20. The system of claim 19 wherein the radiation reflective material has a thickness of between 280 nm to 320 nm.

21. The system of claim 19 wherein radiation absorbing material is selected from the group consisting of tungsten, titanium, titanium nitride, aluminum and mixtures thereof.

22. The system of claim 17 wherein the at least one non-active region is characterized by having a surface that is formed of material that has an emissivity of at least 0.25.

23. The system of claim 18 wherein the at least one non-active region is characterized by having a surface that is formed of material that has an emissivity of at least 0.40.

24. The system of claim 17 wherein the at least one non-active region has a collective surface area that is at least 40% of the collective surface area of the first and second surfaces of the substrate.

25. The system of claim 17 wherein the first surface of the substrate defines a rectangularly-shaped surface having four sides and the at least one non-active region comprises four non-active regions each of which borders a side of the rectangularly-shaped surface.

* * * * *